United States Patent [19]
Lee

[11] Patent Number: 6,128,215
[45] Date of Patent: Oct. 3, 2000

[54] STATIC RANDOM ACCESS MEMORY CIRCUITS

[75] Inventor: Andy Lee, San Jose, Calif.

[73] Assignee: Altera Corporation, San Jose, Calif.

[21] Appl. No.: 09/038,123

[22] Filed: Mar. 11, 1998

Related U.S. Application Data

[60] Provisional application No. 60/056,165, Aug. 19, 1997.

[51] Int. Cl.[7] ................................................... G11C 11/40
[52] U.S. Cl. ............................ 365/154; 365/201; 326/39; 326/40
[58] Field of Search ..................................... 365/154, 155, 365/156, 200, 189.01, 201; 326/38, 39, 40, 37, 46

[56] References Cited

U.S. PATENT DOCUMENTS

| | | | |
|---|---|---|---|
| Re. 34,363 | 8/1993 | Freeman | 307/465 |
| 4,642,487 | 2/1987 | Carter | 307/465 |
| 4,706,216 | 11/1987 | Carter | 365/94 |
| 4,758,985 | 7/1988 | Carter | 365/94 |
| 4,777,623 | 10/1988 | Shimazu et al. | 365/201 |
| 4,870,302 | 9/1989 | Freeman | 307/465 |
| 4,928,266 | 5/1990 | Abbott et al. | 365/154 |
| 5,089,993 | 2/1992 | Neal et al. | 365/63 |
| 5,128,559 | 7/1992 | Steele | 307/465 |
| 5,212,663 | 5/1993 | Leong | 365/189.01 |
| 5,237,219 | 8/1993 | Cliff | 307/465 |
| 5,258,668 | 11/1993 | Cliff et al. | 307/465 |
| 5,260,610 | 11/1993 | Pedersen et al. | 307/465 |
| 5,325,325 | 6/1994 | Azuma | 365/156 |
| 5,450,022 | 9/1995 | New | 326/39 |
| 5,450,353 | 9/1995 | Voike | 365/154 |
| 5,469,400 | 11/1995 | Yamano | 365/230.01 |
| 5,689,195 | 11/1997 | Cliff et al. | 326/41 |

OTHER PUBLICATIONS

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronic Design, Jul. 8, 1971, pp. 70–72.

S.C. Hu, "Cellular Synthesis of Synchronous Sequential Machines", IEEE Transactions on Computers, Dec. 1972, pp. 1399–1405.

E.W. Page, "Programmable Array Realizations of Sequential Machines," Department of Electrical Engineering, Duke University, Doctoral Dissertation, 1973.

Howard A. Sholl et al., "Design of Asynchronous Sequential Networks Using Read–Only Memories", IEEE Transactions on Computers, vol. C–24, No. 2, Feb. 1975, pp. 195–206.

(List continued on next page.)

*Primary Examiner*—Tan T. Nguyen
*Attorney, Agent, or Firm*—Fish & Neave; Robert R. Jackson

[57] ABSTRACT

A static random access memory ("SRAM") that is especially suitable for such uses as inclusion on a programmable logic device to provide programmable control of the configuration of that device. The SRAM includes a plurality of SRAM cells, all of which are simultaneously cleared to a first of two logic states by application of a second of the two logic states to clear terminals of the cells. Any cell that needs to be programmed to the second of the two logic states is thereafter specifically addressed and a data signal thereby applied which programs the cell to the second logic state. The cells are preferably constructed so that they are programmed to the second logic state by application of a data signal having the first logic state. Even a very small unipolar MOS pass gate transistor can therefore be used as the addressable path through which the data signal is applied. The memory may also include circuitry for verifying the contents of each cell via the data input terminal of the cell.

53 Claims, 7 Drawing Sheets

OTHER PUBLICATIONS

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

David A. Hodges et al., *Analysis and Design of Digital Integrated Circuits*, Second Edition, McGraw–Hill Publishing Company, New York, 1998, pp. 364–369.

"Optimized Reconfigurable Cell Array (ORCA) Series Field–Programmable Gate Arrays," Advanced Data Sheet, Feb. 1993, AT&T Microelectronics, pp. 1–87.

*The Programmable Logic Data Book*, Xilinx, Inc., 1994, pp. 2–5 through 2–102.

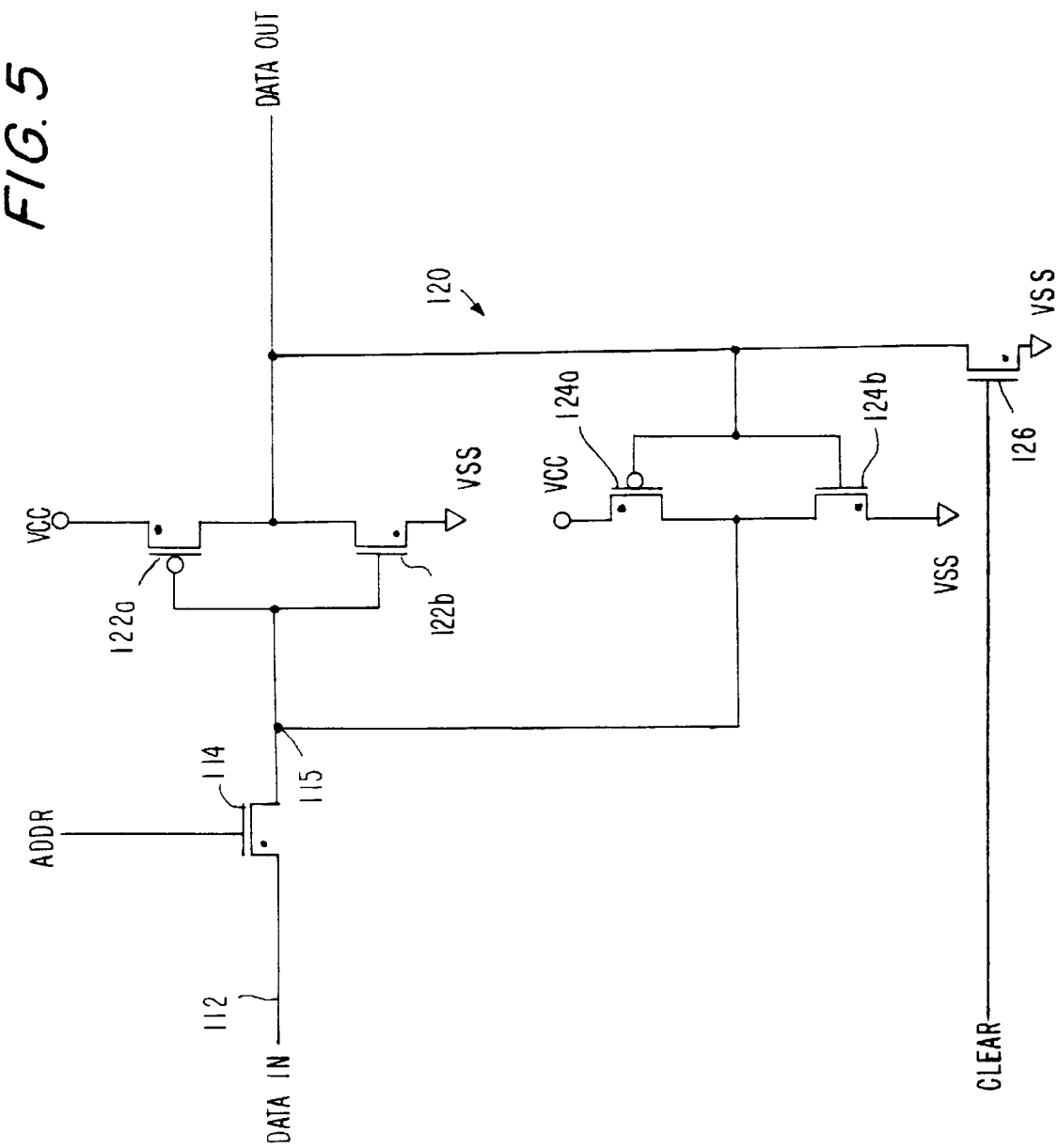

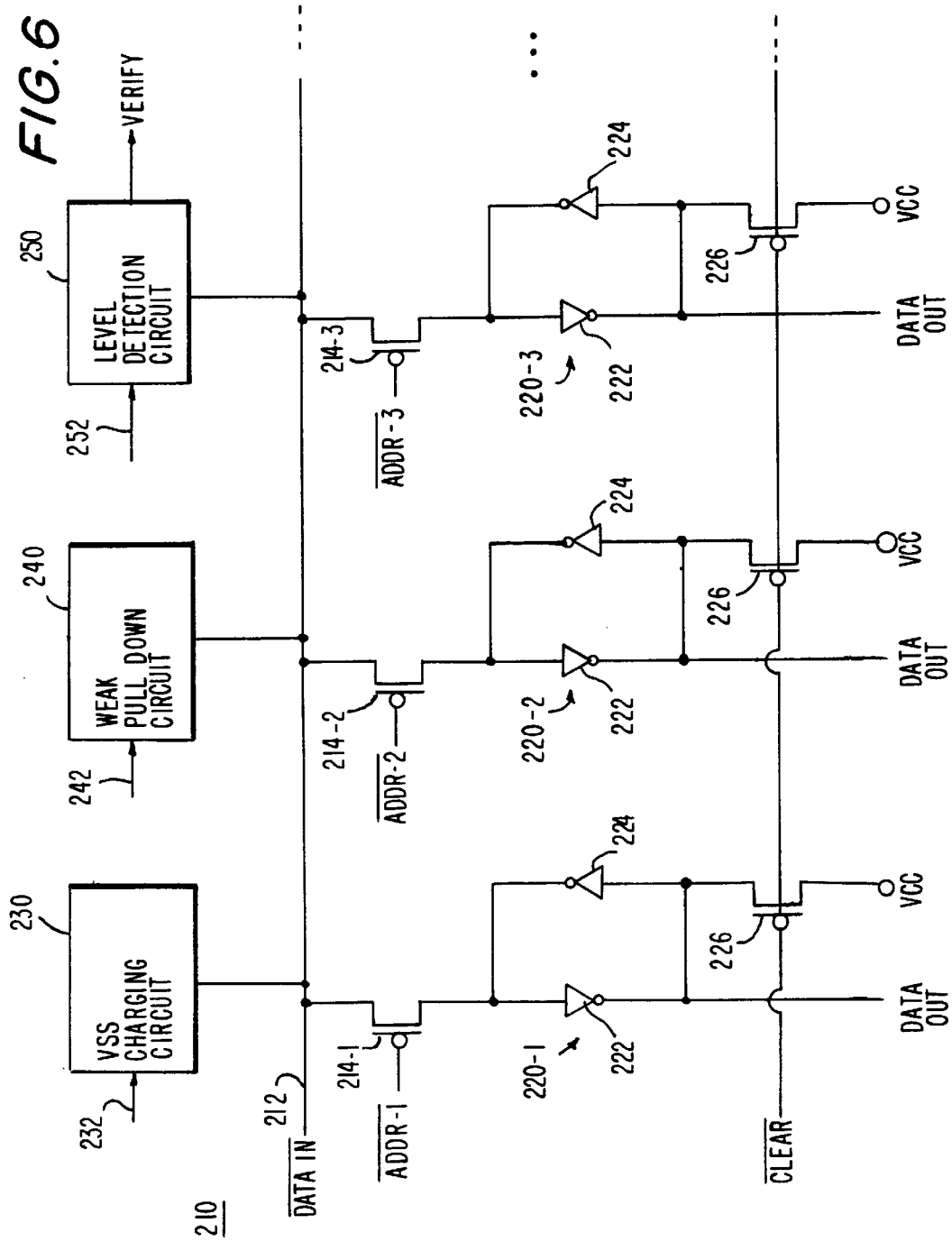

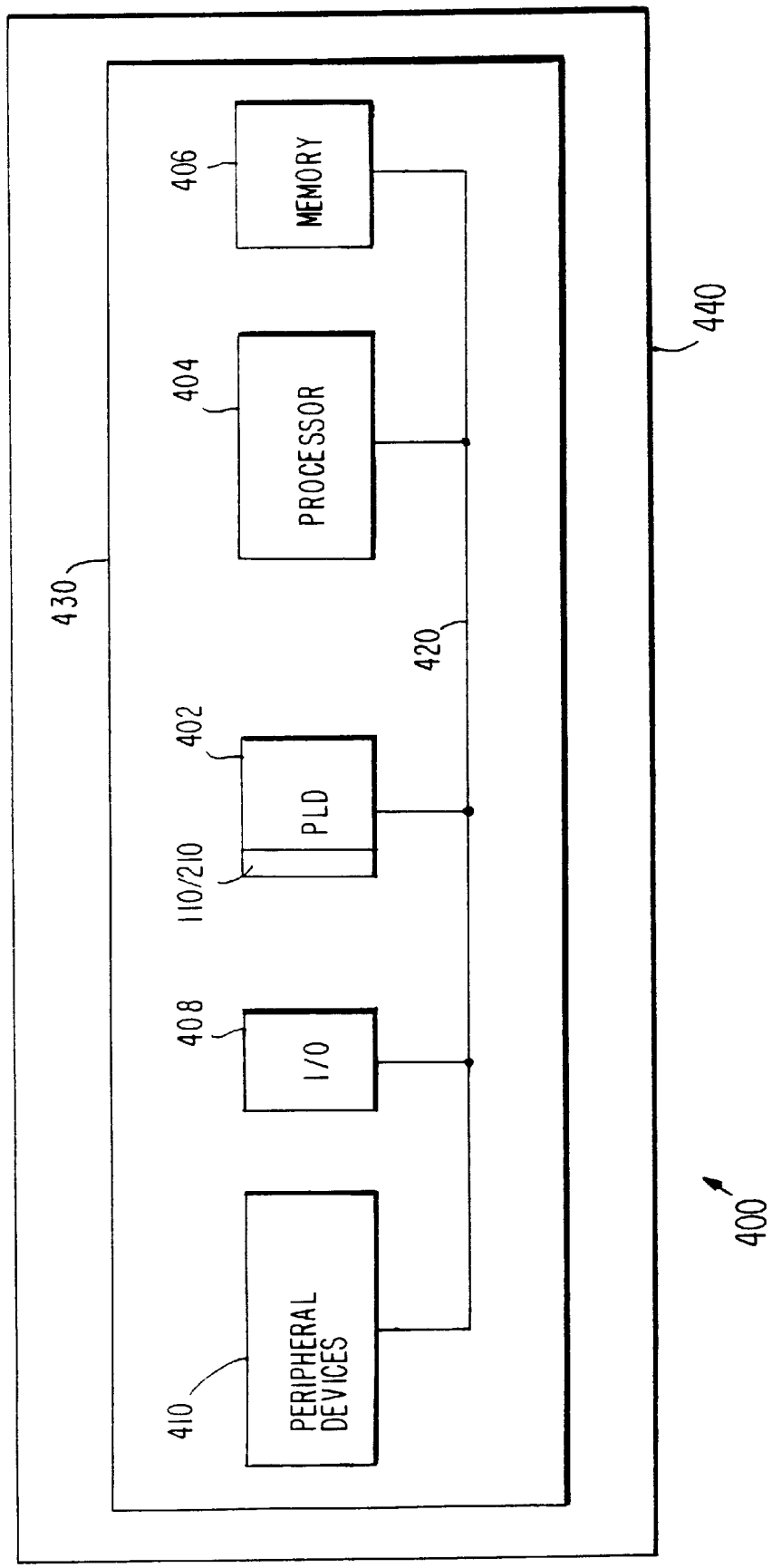

STATIC RANDOM ACCESS MEMORY CIRCUITS

This application claims the benefit of U.S. provisional application Ser. No. 60/056,165, filed Aug. 19, 1997.

BACKGROUND OF THE INVENTION

This invention relates to static random access memory circuits, and more particularly to static random access memory circuits that are especially suitable for such purposes as inclusion on programmable logic integrated circuit devices for programmable control of the configuration of those devices.

One example of a known programmable logic device 500 is shown in FIG. 1. Device 500 may be generally like the programmable logic devices shown and described in Cliff et al. U.S. Pat. No. 5,689,195, which is hereby incorporated by reference herein. Device 500 includes a plurality of regions 510 of programmable logic disposed on the device in a two-dimensional array of intersecting rows and columns of such regions. Each region includes a plurality of subregions 512 of programmable logic. For example, each subregion 512 may include a four-input look-up table which is programmable to produce a "combinatorial" output signal which can be any logical combination of four input signals applied to the look-up table. Each subregion 512 may additionally include a register (e.g., a flip-flop) for selectively registering (storing) the combinatorial output signal to produce a registered output signal. And each subregion 512 may include programmable logic connectors ("PLCs") for programmably selecting either the combinatorial or registered output signal as the final output signal of the subregion.

A plurality of horizontal interconnection conductors 520 is associated with each row of regions 510 for conveying signals to, from, and/or between the regions in the associated row. A plurality of vertical interconnection conductors 530 is associated with each column of regions 510 for conveying signals to, from, and/or between the various rows. A plurality of local conductors 540 is associated with each region 510 for making selected signals on the adjacent horizontal conductors 520 available to the associated region. PLCs 522 are provided for making programmable connections between selected intersecting conductors 520 and 540. A plurality of subregion feeding conductors 550 is associated with each subregion 512 for applying selected signals on the adjacent conductors 540 (and adjacent local feedback conductors 560 (described below)) to the associated subregion. PLCs 542 are provided for making programmable connections between intersecting conductors 540/560 and 550. The output signal of each subregion 512 can be applied to selected adjacent vertical conductors via PLCs 562 and/or to selected horizontal conductors 520 via PLCs 564. The output signal of each subregion 512 is also made available as a local feedback signal (via a conductor 560) to all of the subregions in the region 510 that includes that subregion. Selected intersecting horizontal and vertical conductors are programmably interconnectable by PLCs 532.

Another example of a known programmable logic device 600 is shown in FIG. 2. Device 600 may be generally like the programmable logic devices shown in Freeman U.S. Pat. No. Re. 34,363, which is also hereby incorporated by reference herein. Device 600 includes a plurality of configurable logic blocks ("CLBs") 610 disposed on the device in a two-dimensional array of intersecting rows and columns of CLBs. Each CLB 610 may include one or two small, programmable, look-up tables and other circuitry such as a register and PLCs for routing signals within the CLB. A plurality of horizontal interconnection conductor tracks 620 are disposed above and below each row of CLBs 610. A plurality of vertical interconnection conductor tracks 630 are disposed to the left and right of each column of CLBs 610. Local conductors 640 are provided for bringing signals into each CLB 610 from selected conductor tracks 620/630 adjacent to each side of the CLB and/or for applying signals from the CLB to selected adjacent conductor tracks 620/630. PLCs 622/632 are provided for making programmable connections between selected intersecting conductors 620/630 and 640. PLCs 624 are provided for making programmable connections between selected conductors segments in tracks 620 and/or 630 that intersect or otherwise come together at the locations of those PLCs.

In programmable logic devices such as those shown in FIGS. 1 and 2, first-in/first-out ("FIFO") chains of static random access memory ("SRAM") cells are commonly used on the device for programmable control of the configuration of the device. For example, the SRAM cells in such FIFO chains may be used to control the logic performed by each subregion 512 or CLB 610 (e.g., by constituting or controlling the data stored in the look-up tables in those components and by controlling the connections made by the PLCs in those components). The SRAM cells in the FIFO chains may also be used to control the connections made by the various interconnection conductor PLCs (e.g., PLCs 522, 532, 542, 562, 564, 622, 624, and 632) on the device. A typical prior art FIFO SRAM chain 10 will now be described with reference to FIG. 3.

In the FIFO SRAM chain 10 shown in FIG. 3, each SRAM cell 20 includes a relatively strong, forwardly directed inverter 22 connected in a closed loop series with a relatively weak, backwardly directed inverter 24. In the absence of a signal passed from above by an NMOS pass gate 14, each inverter 24 is strong enough to hold the associated inverter 22 in whatever state it was left by the most recent signal passed by the pass gate 14 immediately above. On the other hand, each inverter 24 is not strong enough to prevent the associated inverter 22 from responding to any signal passed by the pass gate 14 immediately above.

Programming data is applied to FIFO chain 10 via DATA IN lead 12 at the start of the chain. Initially all of pass gates 14 are enabled by address signals ADDR-1 through ADDR-N. This allows the first programming data bit to pass all the way down the chain (inverted by each successive inverter 22 that it passes through) until it reaches and is stored in cell 20-N. Pass gate 14-N is then turned off by changing the ADDR-N signal to logic 0. The next programming data bit from lead 12 therefore passes down the chain until it reaches and is stored in the cell immediately above cell 20-N (not shown but similar to all other cells 20). The NMOS pass gate 14 above the cell above cell 20-N is then turned off and the next programming data bit is applied to lead 12. This process continues until all of cells 20 have been programmed and all of pass gates 14 have been turned off. Each cell 20 outputs the data it stores via its DATA OUT lead. These DATA OUT signals may be used to control various aspects of the operation of a programmable logic device that includes chain 10. For example, a DATA OUT signal from chain 10 may control a programmable aspect of the "architecture" of the programmable logic device (e.g., which of several available clock or clear signals a register in a subregion 512 (FIG. 1) or a CLB 610 (FIG. 2) responds to). Or a DATA OUT signal from chain 10 may control a programmable aspect of the logic performed by the device (e.g., by being a datum in a look-up table in a subregion 512 or a CLB 610). As still another example, a DATA OUT signal from chain 10 may control an interconnection conductor PLC (e.g., a PLC 522, 532, etc. (FIG. 1), or a PLC 622, 624, etc. (FIG. 2)) on the device.

The contents of chain 10 may be verified by using the ADDR signals to enable pass gates 14 progressively from the bottom up. This allows the data in cells 20 to be read out one after another from the bottom up via VERIFY lead 16.

It will be apparent from the foregoing that in order to program or verify chain 10 each NMOS pass gate 14 must be able to effectively pass both logic 0 and logic 1 signals. When circuit components are made very small (as is becoming possible as a result of on-going advances in the techniques for semiconductor fabrication) and VCC (the power voltage used for logic 1 signals) is accordingly reduced, an NMOS pass gate 14 may not be able to pass a logic 1 signal that is sufficiently strong to overwrite the logic 0 output of the inverter 24 below it unless the pass gate is made undesirably large. Any unipolar MOS (i.e., NMOS or PMOS) pass gate will have this or a similar problem in these circumstances. Thus a PMOS pass gate does not pass logic 0 very well under the above-described conditions that reduce the effectiveness of an NMOS pass gate in passing logic 1. FIFO SRAM chains are therefore becoming less satisfactory for use as the programmable elements in products such as programmable logic devices.

In view of the foregoing, it is an object of this invention to provide improved SRAMs for use on programmable logic devices or in other similar contexts.

It is a more particular object of this invention to provide SRAMs that can be used on programmable logic devices that are made using advanced integrated circuit fabrication techniques and therefore with extremely small circuit components and/or with the intention of using relatively low VCC potential.

SUMMARY OF THE INVENTION

These and other objects of the invention are accomplished in accordance with the principles of the invention by providing an SRAM made up of SRAM cells, all of which store a first of two logic states when the SRAM is initialized, and which are individually or specifically addressed during programming mode when it is desired to change the state of an addressed cell to the second of the two logic states. In addition, the address connection of each cell is such that the cell is changed to the second logic state by passing a logic 0 signal through an NMOS pass gate to the cell, or by passing a logic 1 signal through a PMOS pass gate to the cell. Even NMOS pass gates that are too small to reliably pass logic 1 signals pass logic 0 signals perfectly satisfactorily. Similarly, even PMOS pass gates that are too small to reliably pass logic 0 signals pass logic 1 signals satisfactorily.

The data input terminal of each SRAM cell can also be used to verify the contents of the cell after programming. To verify a cell's contents, a lead that is used to supply data to the cells during programming is charged to the second logic state and then weakly held at that potential. The cell to be verified is then addressed to connect the data input terminal of the cell to the above-mentioned data input lead. If the cell has the first logic state, the cell will not try to discharge the data input lead, which will therefore remain at the second logic potential. On the other hand, if the cell is at the second logic potential, the cell will gradually discharge the data input lead to the first logic potential (although the cell itself will not change from the second logic state to the first logic state). Thus the potential on the data input lead after the foregoing operations can be used to verify the contents of the SRAM cell being tested.

Further features of the invention, its nature and various advantages will be more apparent from the accompanying drawings and the following detailed description of the preferred embodiments.

BRIEF DESCRIPTION OF THE DRAWINGS

FIG. 5 is a more detailed schematic diagram of an illustrative embodiment of a representative portion of the circuitry shown in FIG. 4.

FIG. 6 is a diagram similar to FIG. 4 showing an alternative illustrative embodiment of an SRAM constructed in accordance with the invention.

FIG. 7 is a simplified block diagram of an illustrative embodiment of a system which includes a programmable logic device configured by an SRAM of this invention, all in accordance with the invention.

DETAILED DESCRIPTION OF THE PREFERRED EMBODIMENTS

Figure 3:
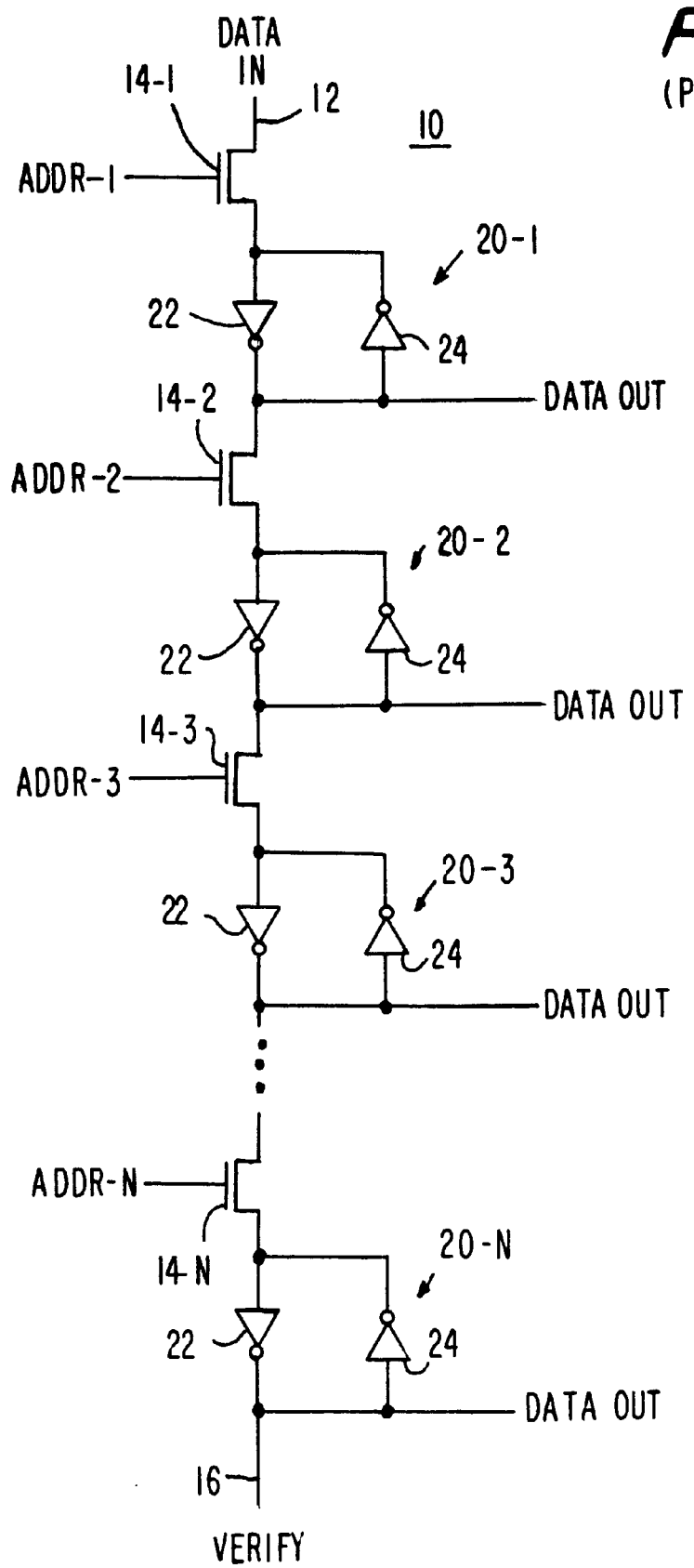
FIG. 3 is a simplified schematic diagram of a conventional FIFO SRAM chain.
Figure 4:
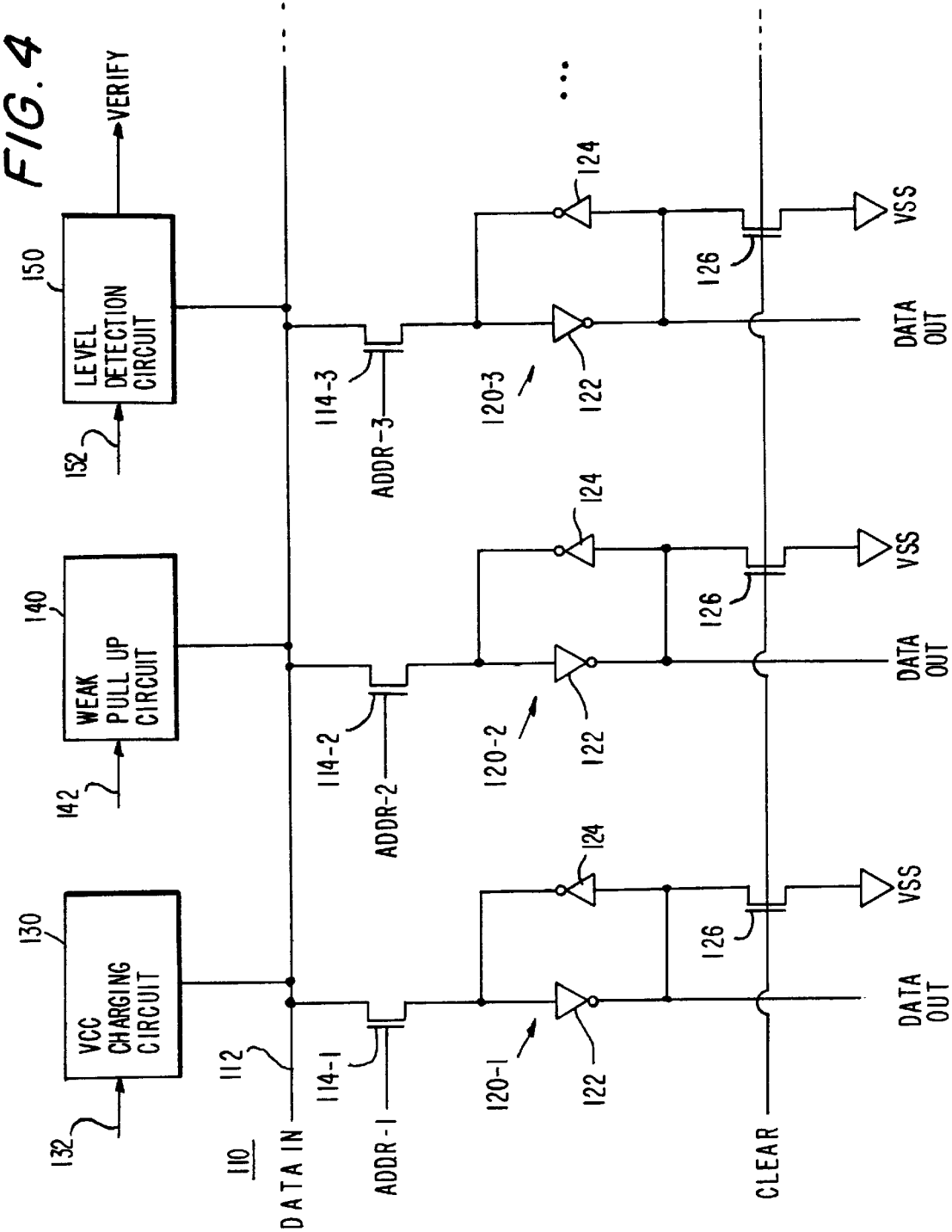
FIG. 4 is a simplified schematic block diagram of representative portions of an illustrative embodiment of an SRAM constructed in accordance with this invention.

A representative portion of an illustrative embodiment of SRAM circuitry 110 in accordance with this invention is shown in FIG. 4. SRAM circuitry 110 includes any desired number of SRAM cells 120, each of which is selectively connectable to a common DATA IN lead 112 via a respective NMOS pass gate 114. Each SRAM cell 120 includes a relatively strong inverter 122 connected in a closed loop series with a relatively weak inverter 124. A more detailed circuit diagram of a representative SRAM cell 120 is shown in FIG. 5 and described later in this specification. The output terminal of each SRAM cell's strong inverter 122 is the DATA OUT lead of that cell. Assuming that SRAM circuitry 110 is included on a programmable logic device, the DATA OUT signals of that circuitry can be used in any way that the DATA OUT signals in FIG. 3 can be used to programmably control various aspects of the connectivity and operation (generically the "configuration") of the programmable logic (e.g., as described above in connection with FIGS. 1–3 for the illustrative programmable logic device organizations shown in FIGS. 1 and 2). The DATA OUT terminal of each SRAM cell is also selectively connectable to VSS (logic 0 (ground)) via an associated NMOS pass gate 126. All of gates 126 are enabled in parallel by a logic 1 signal applied to the CLEAR lead. VCC charging circuit 130, week pull up circuit 140, and level detection circuit 150 are used only during operation of the circuitry to verify the contents of SRAM cells 120. These circuit components are therefore initially inoperative and have no effect on the circuitry.

To program memory circuitry 110 all of pass gates 114 are disabled by logic 0 address signals ADDR-1, ADDR-2, etc.

All cells 120 are then cleared by causing the CLEAR signal to go to logic 1. This enables all of pass gates 126, thereby applying logic 0 to the input terminal of the inverter 124 in each cell 120. The resulting logic 1 output of each inverter 124 causes the output of the associated inverter 122 to become logic 0, thereby holding the DATA OUT signal of each cell 120 at logic 0 even after the CLEAR signal returns to logic 0.

After all of cells 120 have been cleared to logic 0 as described above, elements 112 and 114 are used to write logic 1 into only those cells that need to be programmed to logic 1. Logic 0 is applied to DATA IN lead 112. Then logic 1 is applied (sequentially or simultaneously as desired) to the ADDR leads of the pass gates 114 of only those cells 120 that need to be switched from logic 0 to logic 1. Enabling the pass gate 114 of a cell in this way causes the logic 0 signal on DATA IN lead 112 to be applied to the input terminal of that cell's inverter 122. This causes the output terminal of that inverter (and therefore the DATA OUT signal of that cell) to switch to logic 1. The associated inverter 124 operates to hold that inverter 122 in the logic 1 output condition even after the associated ADDR signal switches back to logic 0, thereby disconnecting the memory cell from DATA IN lead 112. This completes the process of programming cells 120.

In actual practice in which the circuitry shown in FIG. 4 is repeated a number of times but with the ADDR signals shared by all the repetitions, it may be necessary, when enabling a particular address line as described above, to apply logic 1 to the DATA IN leads 112 of any repetitions in which the addressed SRAM cells 120 are not to be programmed logic 1. This will prevent inadvertent switching from logic 0 to logic 1 of SRAM cells 120 that are not to be so switched. Structures including repetitions of the FIG. 4 circuitry are discussed in more detail below.

From the foregoing it will seen that all cells 120 are initially cleared to logic 0. Then only those cells requiring programming to logic 1 are addressed and overwritten with logic 1. To do this overwriting, the NMOS pass gates of the cells to be overwritten are only required to pass logic 0, which they do very well even when they are made very small. The circuitry also operates very well with relatively low VCC (logic 1 (power)) voltage or potential, since pass gates 114 are not required to pass logic 1 in order to program cells 120.

After cells 120 have been programmed as described above, their contents can be verified as will now be described. DATA IN lead 112 is first isolated from other signal sources such as the data signal source. VCC charging circuit 130 is then turned on via its control lead 132 to charge lead 112 to logic 1. Circuit 130 is then turned off and weak pull up circuit 140 is turned on via its control lead 142 to apply a weak pull up (logic 1) signal to lead 112. A logic 1 signal is then applied to the ADDR lead of the memory cell 120 whose content is to be verified. This turns on the associated NMOS pass gate 114. If the cell 120 being verified is storing logic 0, the output of that cell's inverter 124 will be logic 1 and there will be no tendency of the voltage on lead 112 to drop from logic 1. On the other hand, if the cell 120 being verified is storing logic 1, the output signal of that cell's inverter 124 will be logic 0, which will cause the voltage on lead 112 to gradually fall from logic 1 toward logic 0. (Under these conditions, the logic 1 signal from lead 112 is not strong enough to change the state of the cell 120 being verified.) Level detection circuit 150 is turned on via its control lead 152 a suitable time interval after the transistor 114 of the cell being verified is turned on. If the voltage on lead 112 is still logic 1, circuit 150 produces a VERIFY output signal which indicates that the cell being verified is storing logic 0. On the other hand, if the voltage on lead 112 has fallen to logic 0 (or sufficiently far toward logic 0), circuit 150 produces a VERIFY output signal which indicates that the cell being verified is storing logic 1.

The foregoing verification steps are repeated for each cell 120 along line 112 to be verified.

It will be noted that the above-described verification process is not destructive of the data stored in cells 120.

A programmable logic device will typically include several repetitions of the FIG. 4 circuitry (i.e., several parallel DATA IN leads 112 and associated circuitry). The ADDR-1, ADDR-2, etc., signals will be shared by all of these parallel SRAM strings. In particular, one SRAM cell 120-1 in each string will be controlled by a common ADDR-1 signal, another one SRAM cell 120-2 in each string will be controlled by a common ADDR-2 signal, and so on. Thus (as has already been mentioned) when it is desired to program the SRAM cells controlled by any particular address signal, it may be necessary to apply logic 1 to some DATA IN lines 112 to prevent the associated SRAM cells from inadvertently switching from their initial logic 0 output condition.

An illustrative embodiment of a representative SRAM cell 120 is shown in more detail in FIG. 5. Relatively strong inverter 122 is made up of P-channel transistor 122*a* and N-channel transistor 122*b*. Relatively weak inverter 124 is made up of P-channel transistor 124*a* and N-channel transistor 124*b*. In order for clear pass gate 126 to reset cell 120 to logic 0 as described above, the conductance of transistor 126 should be greater than the conductance of transistor 122*a*. In order for a logic 0 data signal on lead 112 to cause cell 120 to switch from a reset logic 0 data output to a logic 1 data output as described above, the conductance of transistor 114 should be greater than the conductance of transistor 124*a*. In order to use lead 112 to verify the contents of cell 120 as described above, the conductance of transistor 124*b* should be greater than the conductance of transistor 114. This conductance relationship can be satisfied by making transistors 124*b* and 114 the same size because lower Vgs and body effect decreases the conductance of transistor 114 as the data input terminal 115 of cell 120 begins to rise in voltage.

FIG. 6 shows an alternative embodiment of the FIG. 4 circuitry in which elements 114 and 126 are converted from NMOS pass gates to PMOS pass gates 214 and 226. Other appropriate modifications are also made, but generally similar elements in FIGS. 4 and 6 have their reference numbers increased by 100 in FIG. 6.

To program the FIG. 6 circuitry 210 all SRAM cells 220 are preset to logic 1. This is done by applying logic 0 to the CLEAR bar lead. Thereafter, to switch the SRAM cells 220 that need to be switched to logic 0, logic 1 is applied to DATA IN bar lead 212 and logic 0 is applied to the ADDR bar lead for each SRAM cell that needs to be switched. This turns on the PMOS pass gate 214 receiving that ADDR bar signal, thereby allowing that pass gate 214 to pass logic 1 from lead 212. This in turn switches the DATA OUT of the associated SRAM cell 220 to logic 0. Again, assuming that SRAM circuitry 210 is included on a programmable logic device, the DATA OUT signals of that circuitry can be used in any way that the DATA OUT signals in FIGS. 3 and 4 can be used to control the configuration of the associated programmable logic device.

Verification of the contents of SRAM cells 220 is similar to verification of the contents of SRAM cells 120 except that the polarity is reversed. Thus DATA IN bar lead 212 is first charged to logic 0 by VSS charging circuit 230. Then weak pull down circuit 240 is placed in operation to weakly hold lead 212 at logic 0. Next, logic 0 is applied to the ADDR bar lead of the pass gate 214 associated with the SRAM cell whose content is to be verified. If that SRAM cell is outputting logic 1, the inverter 224 in that cell will be outputting logic 0 and there will be no effect on the logic 0 potential of lead 212 as a result of enabling the pass gate 214 between those elements. Level detection circuit 250 will therefore detect no change in the potential of lead 212, and circuit 250 will accordingly produce a VERIFY output signal which indicates that the SRAM cell 220 being verified is storing logic 1. On the other hand, if the SRAM CELL 220 being verified is outputting logic 0, the inverter 224 in that SRAM cell will be outputting logic 1. This will cause the potential on lead 212 to rise when the pass gate 214 associated with that SRAM cell is enabled. This change in the potential on lead 212 is detected by level detection circuit 250, which consequently produces a VERIFY output signal indicating that the SRAM cell being verified is storing logic 0.

Figure 1:
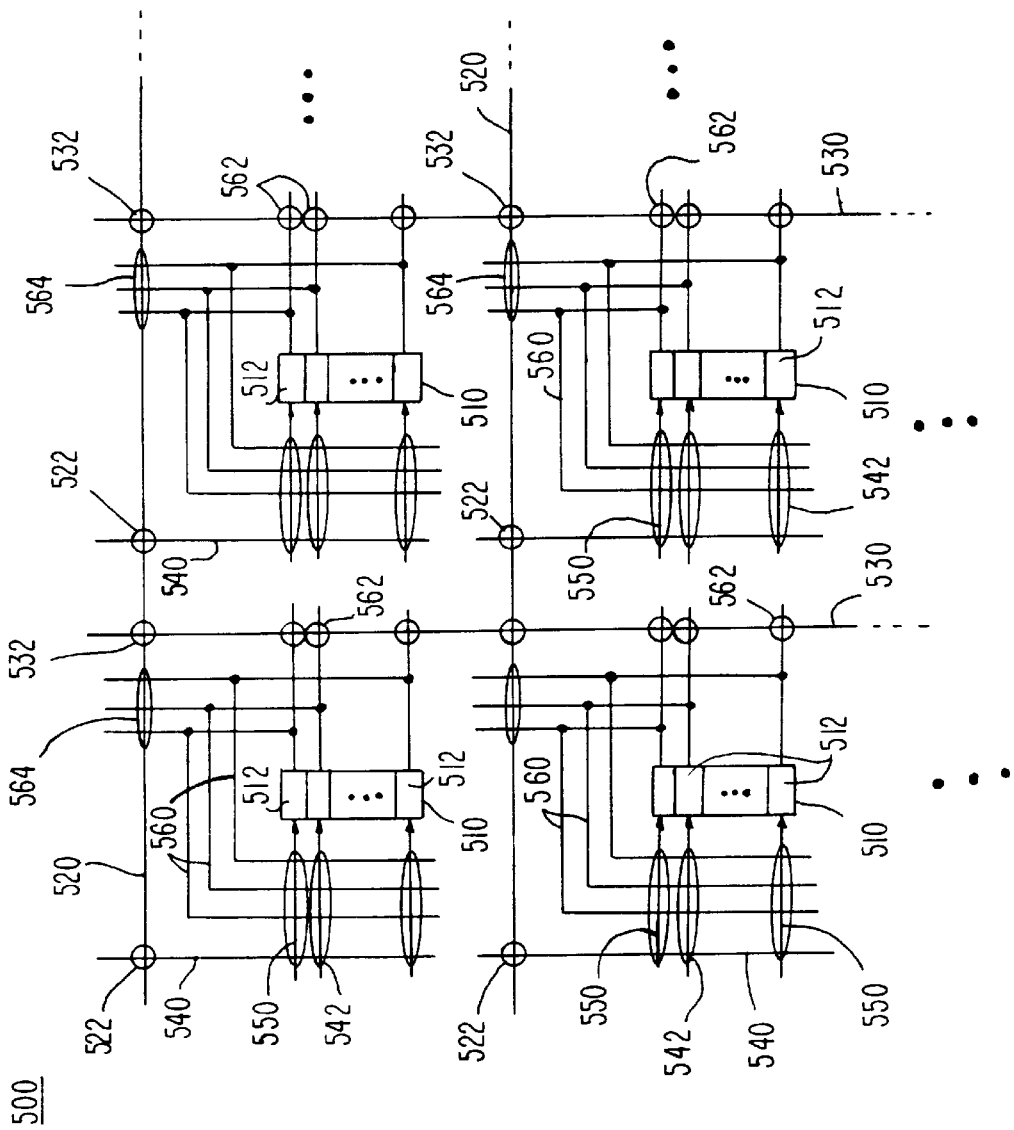
FIG. 1 is a simplified schematic block diagram of a representative portion of illustrative conventional programmable logic device circuitry with which this invention can be used.
Figure 2:
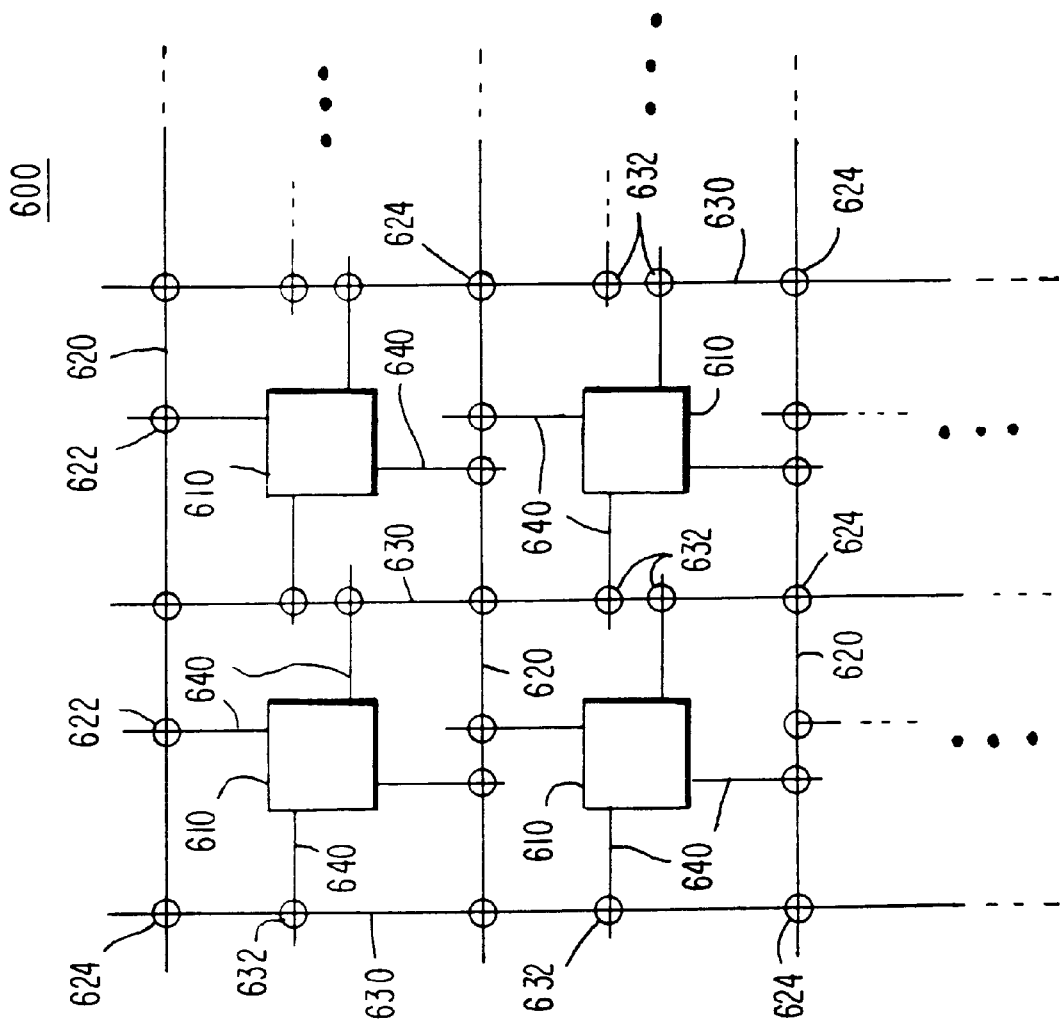
FIG. 2 is similar to FIG. 1, but for another example of conventional programmable logic device circuitry with which the invention can be used.

FIG. 7 illustrates a programmable logic device 402 (which includes one or more SRAMs 110 or 210 in accordance with this invention for programmable control of the configuration of the programmable logic device) in a data processing system 400. The circuitry of device 402 which is controlled by SRAM(s) 110 or 210 may be organized as shown in FIG. 1 or 2 or in any other desired way. In addition to device 402, data processing system 400 may include one or more of the following components: a processor 404; memory 406; I/O circuitry 408; and peripheral devices 410. These components are coupled together by a system bus 420 and are populated on a circuit board 430 which is contained in an end-user system 440.

System 400 can be used in a wide variety of applications, such as computer networking, data networking, instrumentation, video processing, digital signal processing, or any other application where the advantage of using reprogrammable logic is desirable. Programmable logic device 402 can be used to perform a variety of different logic functions. For example, programmable logic device 402 can be configured as a processor or controller that works in cooperation with processor 404. Programmable logic device 402 may also be used as an arbiter for arbitrating access to a shared resource in system 400. In yet another example, programmable logic device 402 can be configured as an interface between processor 404 and one of the other components in system 400. It should be noted that system 400 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention.

The invention claimed is:

1. An apparatus, comprising:
    a programmable logic array, the programmable logic array comprising:
    a plurality of configurable logic elements;
    a plurality of configurable interconnects;
    a plurality of memory cells associated with the plurality of configurable logic elements and the configurable interconnects;
    reset circuitry configured to reset the plurality of memory cells to a first logic state prior to programming the logic array; and
    programming circuitry coupled to the plurality of memory cells, the programming circuitry configured to set selected ones of the plurality of memory cells to a second logic state to program the array by configuring the plurality of configurable logic elements and interconnects to perform a logic function, wherein the selected ones of the plurality of memory cells are those memory cells that need to be programmed to the second logic state.

2. The apparatus of claim 1, wherein the plurality of memory cells are SRAM cells.

3. The apparatus of claim 2, wherein each of the SRAM cells further comprises:
    a data input terminal;
    a data output terminal; and
    a first inverter and a second inverter in a cross-coupled arrangement coupled between the data input and data output terminals.

4. The apparatus of claim 3, wherein the first inverter has a greater conductance relative to the second inverter.

5. The apparatus of claim 3, wherein the data input terminal is coupled to the input of the first inverter.

6. The apparatus of claim 3, wherein the data output terminal is coupled to the output of the first inverter.

7. The apparatus of claim 1, wherein the reset circuitry further comprises a plurality of reset elements coupled to an output terminal of each of the plurality of memory cells respectively.

8. The apparatus of claim 7, wherein the reset elements are pass transistors.

9. The apparatus of claim 8, wherein the pass transistors pull the output terminals of the memory cells to a first potential to reset the memory cells to the first logic state prior to programming.

10. The apparatus of claim 9, wherein the pass transistors pull the output terminals of the memory cells to the first potential in response to a clear signal generated by the reset circuitry.

11. The apparatus of claim 8, wherein the pass transistors are N-channel transistors.

12. The apparatus of claim 8, wherein the pass transistors are P-channel transistors.

13. The apparatus of claim 1, wherein the programming circuitry further comprises a plurality of set elements coupled to an input terminal of each of the plurality of memory cells respectively.

14. The apparatus of claim 13, wherein the programming circuitry further comprises a programming signal generator configured to generate a programming signal having a second potential.

15. The apparatus of claim 14, wherein the programming circuitry further comprises an address signal generator which is configured to generate address signals to address the selected ones of the plurality of memory cells, wherein the programming signal is written into the selectively addressed memory cells to set these memory cells to the second state.

16. The apparatus of claim 13, wherein the set elements are pass transistors.

17. The apparatus of claim 16, wherein the pass transistors are N-channel transistors.

18. The apparatus of claim 16, wherein the pass transistors are P-channel transistors.

19. The apparatus of claim 1, further comprising a verify circuit configured to verify if the first logic state or the second logic state has been programmed into each of the plurality of memory cells.

20. The apparatus of claim 19, wherein the verify circuit further comprises a precharge circuit configured to precharge a data line to a precharge potential.

21. The apparatus of claim 20, wherein the verify circuit further comprises a pull circuit to maintain the data line at the precharge potential.

22. The apparatus of claim 21, further comprising a potential level detection circuit coupled to the data line.

23. The apparatus of claim 22, further comprising a pass element coupled between the selected memory cell and the data line, the pass element configured to selectively couple the selected memory cell and the data line, whereby if the selected memory cell was set to the second logic state, then the data line is moved from the precharge potential, permitting the potential level detection circuit to verify the contents of the selected memory cell.

24. A digital processing system comprising:

processing circuitry;

memory circuitry coupled to the processing circuitry; and an apparatus as defined in claim 1 coupled to the processing circuitry and the memory circuitry.

25. A printed circuit board on which is mounted an apparatus as defined in claim 1.

26. The printed circuit board defined in claim 25 further comprising:

memory circuitry mounted on the printed circuit board and coupled to the apparatus.

27. The printed circuit board defined in claim 25 further comprising:

processing circuitry mounted on the printed circuit board and coupled to the apparatus.

28. An SRAM circuit comprising:

a plurality of SRAM cells, each having a data input terminal, a data output terminal, and a clear terminal, the data input terminal of each cell being connected to that cell to cause the cell to store and output via its data output terminal a logic signal having a first of two logic states in response to a logic signal having a second of the two logic states being applied to said data input terminal, and the clear terminal of each cell being connected to that cell to cause the cell to store and output via its data output terminal a logic signal having the second of the two logic states in response to a logic signal having the second of the two logic states being applied to said clear terminal;

a data signal lead;

a separately addressable data pass gate associated with each of the cells and configured to connect the data signal lead to the data input terminal of the associated cell when addressed;

a logic signal source having the second of the two logic states;

a clear pass gate associated with each of the cells and configured to connect the logic signal source to the clear terminal of the associated cell when the clear pass gate is enabled; and a clear signal lead configured to selectively enable the clear pass gates of all of the cells in parallel.

29. The circuit defined in claim 28 wherein each of the data pass gates comprises a unipolar MOS pass transistor.

30. The circuit defined in claim 28 wherein each of the data pass gates consists essentially of a unipolar MOS pass transistor.

31. The circuit defined in claim 28 wherein each of the clear pass gates comprises a unipolar MOS pass transistor.

32. The circuit defined in claim 28 wherein each of the clear pass gates consists essentially of a unipolar MOS pass transistor.

33. The circuit defined in claim 28 wherein each of the cells comprises:

a relatively strong inverter circuit having a first input terminal and a first output terminal; and a relatively weak inverter circuit having a second input terminal and a second output terminal, the second input terminal being connected to the first output terminal, and the first input terminal being connected to the second output terminal.

34. The circuit defined in claim 33 wherein the data input terminal of each cell is connected to the first input terminal of the cell, and wherein the data output and clear terminals of each cell are connected to the first output terminal of the cell.

35. The circuit defined in claim 28 further comprising:

verification circuitry configured to verify the data output terminal state of each of the cells.

36. The circuit defined in claim 35 wherein the verification circuitry comprises:

a charging circuit configured to selectively charge the data signal lead to a potential indicative of the first of the two logic states; and a level detection circuit configured to detect the potential of the data signal lead after operation of the charging circuit followed by connection of the data signal lead to the data input terminal of one of the cells via the data pass gate associated with that cell.

37. The circuit defined in claim 35 wherein the verification circuitry comprises:

a charging circuit configured to selectively charge the data signal lead to a potential indicative of the first of the two logic states;

a pull circuit configured to weakly urge the data signal lead toward the potential indicative of the first of the two logic states; and a level detection circuit configured to detect the potential of the data signal lead after operation of the charging circuit followed by connection of the data signal lead to the data input terminal of one of the cells via the data pass gate associated with that cell and during operation of the pull circuit.

38. A programmable logic device including an SRAM circuit as defined in claim 28 for controlling configuration of the programmable logic device.

39. A digital processing system comprising:

processing circuitry;

memory circuitry coupled to the processing circuitry; and a device as defined in claim 38 coupled to the processing circuitry and the memory circuitry.

40. A printed circuit board on which is mounted a device as defined in claim 38.

41. The printed circuit board defined in claim 40 further comprising:

memory circuitry mounted on the printed circuit board and coupled to said device.

42. The printed circuit board defined in claim 40 further comprising:

processing circuitry mounted on the printed circuit board and coupled to said device.

43. The method of operating an SRAM circuit which includes a plurality of SRAM cells, each of which has one data input terminal, a data output terminal, and a clear terminal, a data signal lead, a separately addressable data pass gate associated with each of the cells and configured to connect the data signal lead to the data input terminal of the associated cell when addressed, a clear potential source, and a clear pass gate associated with each of the cells and configured to connect the clear terminal of the associated cell to the clear potential source when enabled, the method comprising:

simultaneously enabling all of the clear pass gates to clear all of the cells to a first of two logic states;

applying a data signal to the data signal lead which will cause any cell whose data input terminal receives that data signal to change to a second of the two logic states; and addressing the data pass gates associated with cells which it is desired to change to the second of the two logic states.

44. The method defined in claim 43 further comprising:

charging the data signal lead to a predetermined potential;

addressing the data pass gate associated with a cell; and detecting the potential on the data signal lead to determine the state of the cell whose associated data pass gate has been enabled by the addressing following the charging.

45. The method defined in claim 44 further comprising:

weakly urging the data signal lead toward the predetermined potential after the charging and during the addressing that follows the charging.

46. The method defined in claim 43 wherein the clear potential is logic 0, and wherein each cell that is cleared applies logic 0 to its data output terminal.

47. The method defined in claim 46 wherein each cell responds to the application of logic 0 to its data input terminal by applying logic 1 to its data output terminal, and wherein the applying a data signal to the data signal lead comprises:

applying a logic 0 signal to the data signal lead.

48. The method defined in claim 47 further comprising after the addressing:

charging the data signal lead to a logic 1 potential;

addressing the data pass gate associated with a cell; and detecting the potential on the data signal lead to determine the state of the cell whose associated data pass gate has been enabled by the addressing following the charging.

49. The method defined in claim 48 further comprising:

weakly urging the data signal lead toward logic 1 potential after the charging and during the addressing following the charging.

50. The method defined in claim 43 wherein the clear potential is logic 1, and wherein each cell that is cleared applies logic 1 to its data output terminal.

51. The method defined in claim 50 wherein each cell responds to the application of logic 1 to its data input terminal by applying logic 0 to its data output terminal, and wherein the applying a data signal to the data signal lead comprises:

applying a logic 1 signal to the data signal lead.

52. The method defined in claim 51 further comprising after the addressing:

charging the data signal lead to a logic 0 potential;

addressing the data pass gate associated with a cell; and detecting the potential on the data signal lead to determine the state of the cell whose associated data pass gate has been enabled by the addressing following the charging.

53. The method defined in claim 52 further comprising:

weakly urging the data signal lead toward logic 0 after the charging and during the addressing following the charging.

\* \* \* \* \*